United States Patent [19]

Kaufman

[11] Patent Number: 4,577,387

[45] Date of Patent: Mar. 25, 1986

[54] METHOD OF MOUNTING A COMPACT CIRCUIT PACKAGE TO A HEAT SINK OR THE LIKE

[76] Inventor: Lance R. Kaufman, 131 N. White Oak Way, Mequon, Wis. 53092

[21] Appl. No.: 702,147

[22] Filed: Feb. 15, 1985

Related U.S. Application Data

[62] Division of Ser. No. 546,999, Oct. 31, 1983, Pat. No. 4,546,411.

[51] Int. Cl.[4] ............................................. B23P 25/00
[52] U.S. Cl. ................................... 29/458; 29/526 R; 29/842; 174/16 HS
[58] Field of Search ...................... 29/458, 526 R, 842, 29/843; 174/16 HS; 357/81; 339/17 M; 338/314, 320, 325; 361/395

[56] References Cited

U.S. PATENT DOCUMENTS

| | | | |
|---|---|---|---|
| 3,764,856 | 10/1973 | Martin | 174/16 HS X |
| 3,958,075 | 5/1976 | Kaufman | 174/16 HS |
| 3,996,447 | 12/1976 | Bouffard et al. | 174/16 HS X |
| 4,092,697 | 5/1978 | Spaight | 174/16 HS X |
| 4,155,402 | 5/1979 | Just | 174/16 HS X |
| 4,155,547 | 5/1979 | Rhoades et al. | 174/16 HS X |
| 4,196,411 | 4/1980 | Kaufman | 338/320 X |
| 4,203,186 | 5/1980 | Horner | 29/458 X |
| 4,218,724 | 8/1980 | Kaufman | 339/17 M X |
| 4,237,086 | 12/1980 | Gehle | 174/16 HS X |
| 4,266,267 | 5/1981 | Ruegg | 174/16 HS X |
| 4,394,530 | 7/1983 | Kaufman . | |

FOREIGN PATENT DOCUMENTS 659585 3/1963 Canada ........................... 174/16 HS Primary Examiner—Charlie T. Moon
Attorney, Agent, or Firm—Andrus, Sceales, Starke & Sawall

[57] ABSTRACT

A compact circuit package includes a housing providing a cavity for containing heat generating electrical components. A ceramic substrate is mounted to close the cavity. The package is adapted to be mounted in heat transferring relationship with a heat sink. The bottom surface of the compact circuit package is provided with a self-contained chamber containing a supply of grease. The chamber is defined by the package bottom surface and a bubble of plastic film which overlies the substrate and which is removable sealed to the package around the periphery of the substrate. In this form, the compact circuit package can be transported and stored until ready for use. When the package is ready to be mounted to a heat sink, pressure such as by a finger is applied to the top surface of the bubble film to thereby spreadingly apply the grease to the surface of the substrate. The film is then removed from the bottom of the compact circuit package and the greasy underside of the film placed into engagement with the heat sink surface and rubbed, as by a finger, to thereby spread the remaining residue grease onto the heat sink. The film is then removed and discarded and the compact circuit package mounted to the heat sink.

4 Claims, 6 Drawing Figures

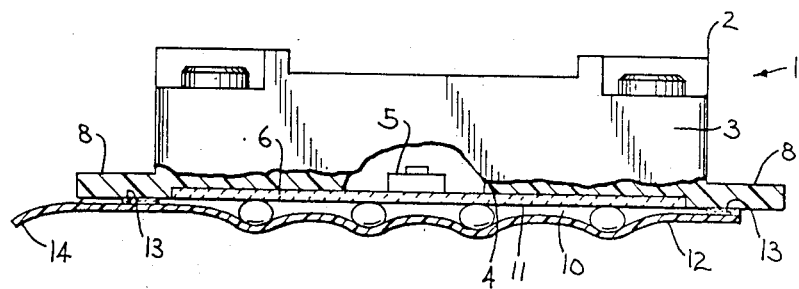
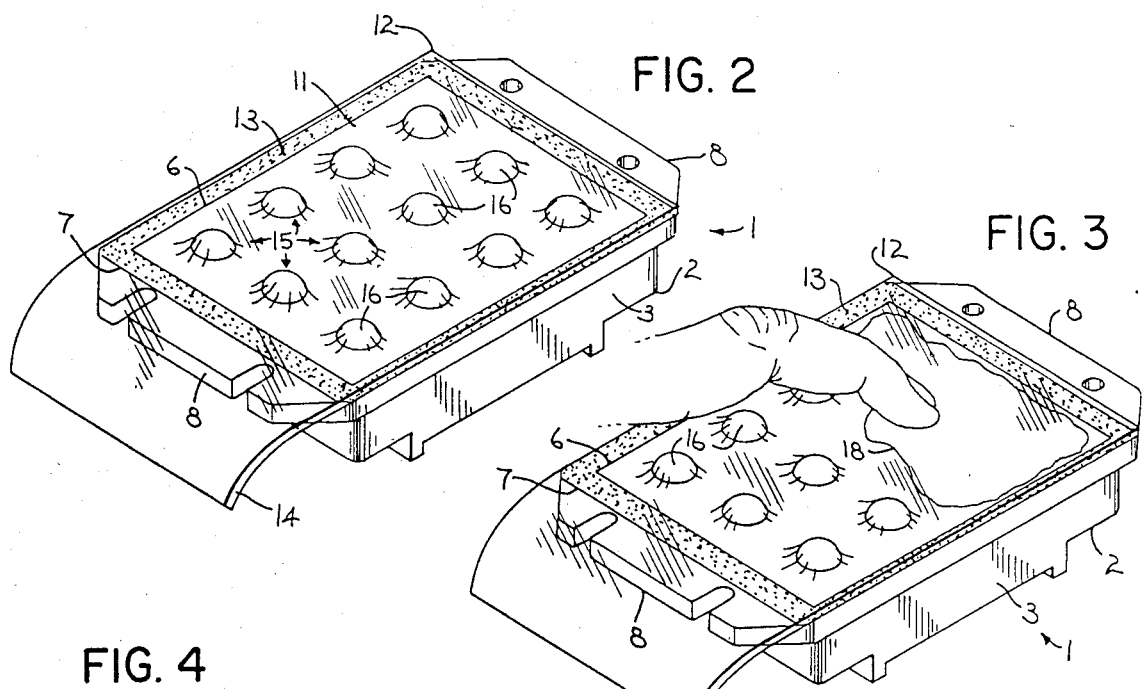
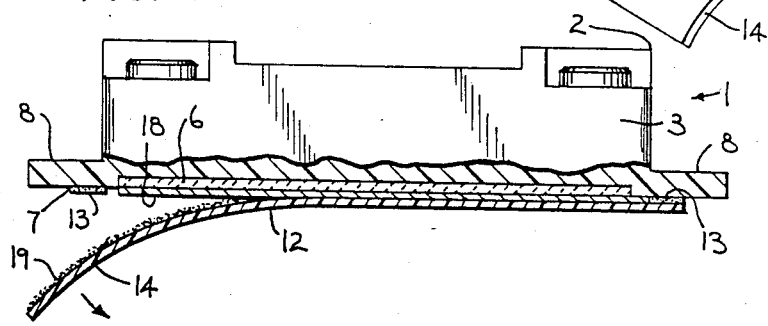
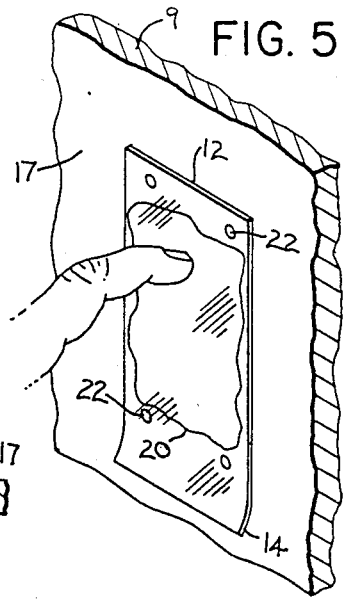
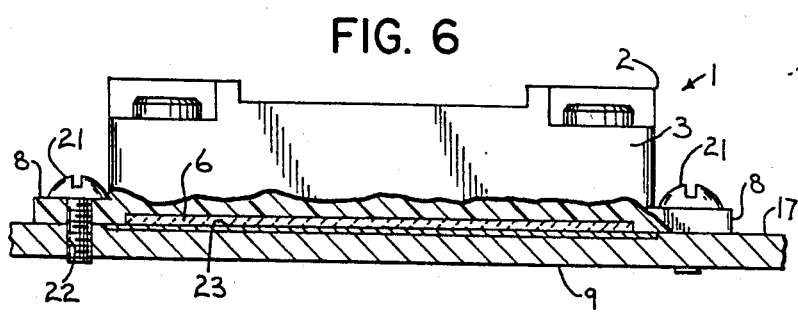

METHOD OF MOUNTING A COMPACT CIRCUIT PACKAGE TO A HEAT SINK OR THE LIKE

This is a division of application Ser No. 546,999, filed Oct. 31, 1983, now U.S. Pat. No. 4,546,411.

BACKGROUND AND SUMMARY OF THE INVENTION

This invention relates to the mounting of a compact circuit package to a heat sink or the like.

Heat conducting, electrically insulating substrates have been advantageously employed to retain heat generating electrical components along a first substrate side while a second oppositely disposed substrate side may be mounted to a heat sink to permit the heat generated by the electrical components to pass through the electrically insulating substrate to be dissipated at the external heat sink. One desirable construction is shown in U.S. Pat. No. 3,958,075.

A wide variety of circuit constructions may be located at or near the insulating substrate and within a cavity provided by the surrounding insulated housing. By way of example, see U.S. Pat. Nos. 4,196,411 and 4,218,724.

Referring more specifically to U.S. Pat. No. 4,218,724, heat conducting, electrically insulating substrates containing one or more heat generating electrical components have been advantageously connected to an insulating housing including a cavity surrounded by one or more edges or abutments which engage the substrate to limit the extent of entry of the substrate into the cavity. Clamping pressure may be applied to the insulating housing to clamp the substrate against an external heat dissipating object such as a heat sink to permit heat to pass from the substrate to the external heat sink without encountering any intervening thermal barriers such as solder, metalization, epoxy or the like.

The insulating housing is usually molded from a suitable plastic and provided with an upper cavity portion which is closed by the substrate and which contains the heat generating electrical components. The bottom housing portion is normally generally planular, surrounds the substrate, and is provided with relatively thin opposed outwardly extending mounting flanges through which threaded bolts or the like extend to mount the assembly to a heat sink.

The electrically insulating substrate, which is usually made from ceramic sheet material is mounted to the housing bottom surface and may be adapted to extend outwardly beyond the surface or may be flush therewith.

It is highly desirable to provide for maximum heat transfer between the ceramic substrate and the heat sink when the compact circuit package is mounted thereto. In order to fill the interstices in the substrate and heat sink surfaces, silicon grease has previously been manually applied to these surfaces before mounting to thereby improve the heat transfer characteristics. Such grease application was normally done in situ, wherein the circuit package installer dipped his fingers into a container of grease and spread the grease onto the ceramic substrate and heat sink with his fingers. This was not only messy, but also required that the installer had a supply of grease readily at hand.

It is an object of the invention to provide an improved concept of supplying and applying grease to the interface between the substrate of a compact circuit package and the heat sink to which the substrate is ultimately mounted.

In accordance with the various aspects of the invention, the bottom surface of the compact circuit package is provided with a self-contained chamber containing a supply of grease. The chamber is defined by the package bottom surface and a bubble of plastic film which overlies the substrate and which is removably sealed to the package around the periphery of the substrate. In this form, the compact circuit package can be transported and stored until ready for use.

When the package is ready to be mounted to a heat sink, pressure such as by a finger is applied to the top surface of the bubble film to thereby spreadingly apply the grease to the surface of the substrate. The film is then removed from the bottom of the compact circuit package and the greasy underside of the film placed into engagement with the heat sink surface and rubbed, as by a finger, to thereby spread the remaining residue grease onto the heat sink. The film is then removed and discarded and the compact circuit package mounted to the heat sink.

The present invention addresses and solves the need for a single, effective technique for providing thermoconductive material at the interface of the heat sink and the circuit package for enhancing heat transfer. Another solution is shown in my co-pending application Ser. No. 547,031, filed Oct. 31, 1983, now U.S. Pat. No. 4,546,410.

BRIEF DESCRIPTION OF THE DRAWINGS

The accompanying drawings illustrate the best mode presently contemplated by the inventor for carrying out the invention.

In the drawings:

FIG. 1 is a side elevation of a compact circuit package constructed in accordance with certain aspects of the invention, with parts in section;

FIG. 2 is a bottom perspective view of the package and showing the bubble chamber;

FIG. 3 is a view similar to FIG. 2 and illustrating spreading of the grease onto the package substrate;

FIG. 4 illustrates removal of the film from the package;

FIG. 5 is a perspective showing of the subsequent application of the greasy side of the film to the heat sink and spreading of the remaining grease thereonto; and FIG. 6 is a side elevation of the compact circuit package mounted to a heat sink.

DESCRIPTION OF THE PREFERRED EMBODIMENT

As shown in the drawings, the concepts of the invention are directed to a compact circuit package 1 of the general type disclosed in the above identified U.S. Pat. No. 4,218,724. Basically, package 1 includes an electrically insulating housing 2 of molded thermoplastic or the like. Housing 2 includes a rectangular upper portion 3 defining an internal cavity 4 adapted to have a plurality of heat generating electrical components 5 disposed therein. At least some of the components 5 may be mounted on a flat substrate 6 of any suitable material which serves to close the open portion of cavity 4. The lower portion of housing 2 includes a peripheral rim 7 which surrounds substrate 6, with the latter being mounted to housing 2 in any suitable well-known manner. In the present embodiment, substrate 6 is basically flush with rim 7, although the substrate could protrude therebeneath. End flanges 8 extend from the bottom of housing 2 for purposes to be described.

The compact circuit package 1 is adapted to be ultimately mounted to an external heat dissipating object, such as the planular wall of a heat sink 9 or the like. See FIG. 6. In so mounting, it is desirable that the maximum interface heat transferring contact be made therebetween.

For this purpose, and referring to FIGS. 1 and 2, package 1 is provided with an enclosed chamber 10 on its lower side. Chamber 10 is defined by the exposed surface 11 of substrate 6 and rim 7, together with a thin bubble of plastic film 12 which overlies substrate 6. Film 12 may be made of any suitable flexible plastic material such as various vinyl based thermoplastic resins developed and sold by Dow Chemical Co. Film 12 is sealingly secured to package 1 around the periphery of substrate 6 as by strips of adhesive 13 applied to rim 7. One end of film 12 extends outwardly beyond adhesive 13 to form a pull tab 14.

Chamber 10 confiningly contains a supply of heat transfer enhancing grease 15 which in the present embodiment is shown as a plurality of spaced deformable grease nodules 16. Grease 16 is preferably of the silicon based type and may be applied in any suitable manner including the screening process.

The complete package assembly with its self-contained grease supply, as shown in FIGS. 1 and 2, may be manufactured at any desired location and stored for later use.

When package 1 is to be installed, it is taken to the site of heat sink 9. The face 17 of heat sink 9 should be as flat, smooth and clean as possible. Furthermore, it is preferable that heat sink 9 be made of Aluminum or Copper which has sufficient thermal mass to maintain the temperature of substrate 6 relatively low, such as below 100° C.

Turning to FIG. 3, the grease 15 within chamber 10 is first caused to spread out into a layer, as at 18, onto exposed surface 11 of substrate 6 within chamber 10. This is accomplished by pressing down on film 12 at nodules 16. Film 12 with a remaining residue 19 of grease thereon is then removed from package 1 by pulling on pull tab 14 to peelingly release the film from the peripheral adhesive 13, as shown in FIG. 4 leaving layer 18 exposed. Referring to FIG. 5, film 12 is then positioned over face 17 of heat sink 9 so that the underside of the film with the grease residue 19 thereon is in contact therewith. Pressing and wiping of film 12 onto heat sink 9 causes the residue to be transferred to face 17 in a spreadout layer 20. Film 12 may then be removed and discarded.

FIG. 6 illustrates the final mounting of compact circuit package 1 to heat sink 9, as by bolts 21 passing through flanges 8 and threadingly into threaded openings 22 in the heat sink wall. The resultant assembly provides a final interposed grease layer 23 comprising a joined composite of layers 18 and 20.

The invention provides a unique concept for increasing the thermal transfer through grease at the interface between a compact circuit package and a heat sink. If desired, instructions for utilization of the inventive concept may be printed directly onto film 12.

Various modes of carrying out the invention are contemplated as being within the scope of the following claims particularly pointing out and distinctly claiming the subject matter which is regarded as the invention.

I claim:

1. A method of mounting a compact circuit package containing heat generating electrical components to the wall of a heat sink, and wherein said package includes a housing having a heat conducting substrate and with a bubble of film overlying said substrate and adhesively secured to said housing peripherally of said substrate and forming an enclosed grease containing chamber, said method comprising the steps of:
   (a) applying external pressure to the outer side of said film to spread a layer of said grease onto said substrate within said chamber,
   (b) removing said film from said housing so that said layer of grease on said substrate is exposed,
   (c) and securing said compact circuit package to the wall of said heat sink so that said layer of grease is interposed therebetween.

2. A method of mounting a compact circuit package containing heat generating electrical components to the wall of a heat sink, and wherein said package includes a housing having a heat conducting substrate and with a bubble of film overlying said substrate and adhesively secured to said housing peripherally of said substrate and forming an enclosed grease containing chamber, said method comprising the steps of:
   (a) applying external pressure to the outer side of said film to spread a layer of said grease onto said substrate within said chamber while leaving a residue of grease on the underside of said film,
   (b) removing said film from said housing so that said layer of grease on said substrate is exposed,
   (c) wiping said film onto the wall of said heat sink so that said grease residue is transferred from the underside of said film onto said heat sink to form a grease layer thereon,
   (d) and subsequently securing said compact circuit package to the wall of said heat sink so that the grease from said layers if disposed therebetween whereby heat transfer from said package to said heat sink is maximized.

3. The method of claim 2:
   (a) wherein said grease is initially contained within said enclosed chamber in the form of spaced nodules,
   (b) and said external pressure is applied through said film onto said nodules.

4. The method of claim 3 wherein said film removing step comprises peeling said film from its peripheral adhesive securement to said housing.

* * * * *

UNITED STATES PATENT AND TRADEMARK OFFICE
CERTIFICATE OF CORRECTION

PATENT NO. : 4,577,387

DATED : March 25, 1986

INVENTOR(S) : LANCE R. KAUFMAN

It is certified that error appears in the above-identified patent and that said Letters Patent is hereby corrected as shown below:

In Claim 2, column 4, line 47, delete "if" and insert --is--

Signed and Sealed this

Eighth Day of July 1986

[SEAL]

Attest:

DONALD J. QUIGG

Attesting Officer     Commissioner of Patents and Trademarks